United States Patent [19]

Hwang

[11] Patent Number: 5,364,807
[45] Date of Patent: Nov. 15, 1994

[54] METHOD FOR FABRICATING LDD TRANSITOR UTILIZING HALO IMPLANT

[75] Inventor: Hyun S. Hwang, Seoul, Rep. of Korea

[73] Assignee: Goldstar Electron Co., Ltd., Chungcheongbuk-do, Rep. of Korea

[21] Appl. No.: 134,376

[22] Filed: Oct. 12, 1993

[30] Foreign Application Priority Data

May 14, 1993 [KR] Rep. of Korea ............ 8297/1993

[51] Int. Cl.$^5$ ............................................. H01L 21/265
[52] U.S. Cl. ................................. 437/44; 437/909
[58] Field of Search ............................................. 437/44

[56] References Cited

U.S. PATENT DOCUMENTS

| H000986 | 11/1991 | Codella et al. | 437/44 |
|---|---|---|---|
| 5,043,294 | 8/1991 | Willer et al. | 437/44 |
| 5,063,172 | 11/1991 | Manley | 437/195 |
| 5,296,398 | 3/1994 | Noda | 437/44 |

FOREIGN PATENT DOCUMENTS

| 0244853 | 4/1987 | German Dem. Rep. | 437/44 |
|---|---|---|---|
| 0279351 | 5/1990 | German Dem. Rep. | 437/44 |
| 0071971 | 6/1981 | Japan | 437/44 |
| 4115538 | 4/1992 | Japan | 437/44 |

OTHER PUBLICATIONS

Wolf et al., vol. II, Silicon Processing for the VLSI Era, Lattice Press, 1990, section 5.6.7, pp. 362–363.

*Primary Examiner*—Tom Thomas
*Assistant Examiner*—Lynne A. Gurley
*Attorney, Agent, or Firm*—Poms, Smith, Lande & Rose

[57] ABSTRACT

A method for fabricating an asymmetry HS-GOLD MOSFET by use of a photo etch process in place of a large tilt implantation process, capable of improving a packing density and reducing a junction capacitance of a source region, thereby improving a characteristic of a device to be finally produced. The method includes the steps of forming a gate insulating film and a gate on a p$^-$ type semiconductor substrate, implanting n type impurity ions in the semiconductor substrate so as to symmetrically form n$^-$ type source and drain regions in the semiconductor substrate, forming an insulating film over the entire exposed surface of the resulting structure, subjecting the insulating to an anisotropic etching to form spacers at respective side walls of the gate, implanting n type impurity ions in the semiconductor substrate so as to form n$^+$ type high concentration source and drain regions respectively adjacent to the n$^-$ type source and drain regions, coating a photoresist film over the entire exposed surface of the resulting structure, subjecting the photoresist film to a patterning to expose one of the spacers disposed toward the source region, removing the exposed spacer, and implanting p type impurity ions in the semiconductor substrate through an area defined by removal of the spacer so as to form a p type halo region.

3 Claims, 6 Drawing Sheets

F I G.6c
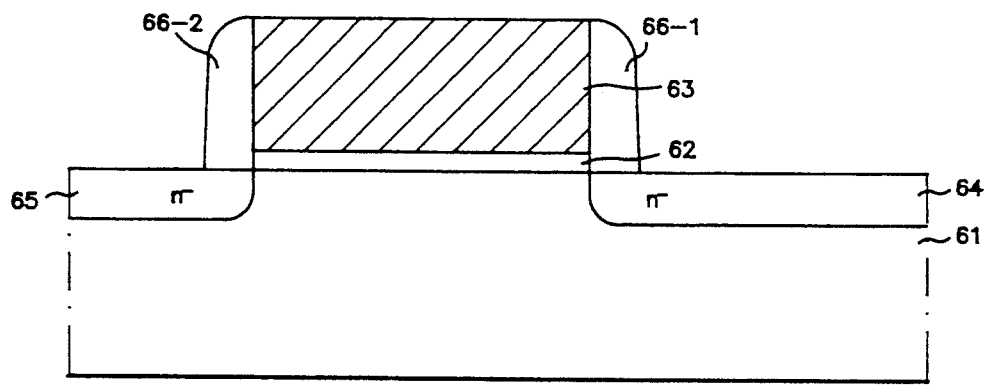
F I G.6d
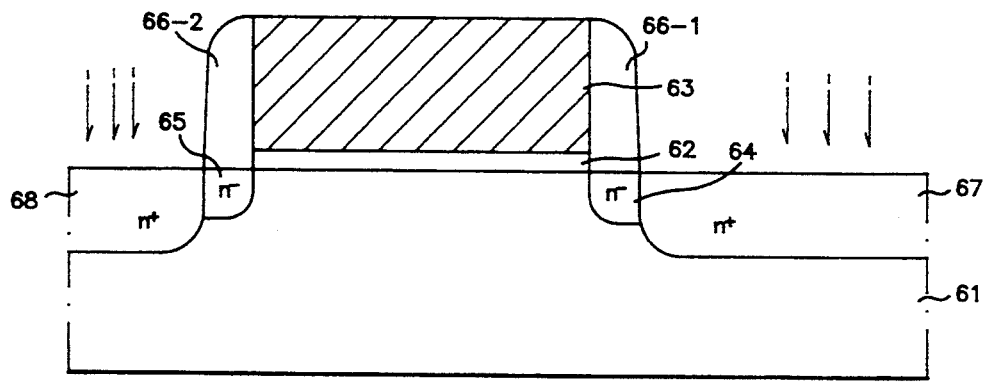
F I G.6e
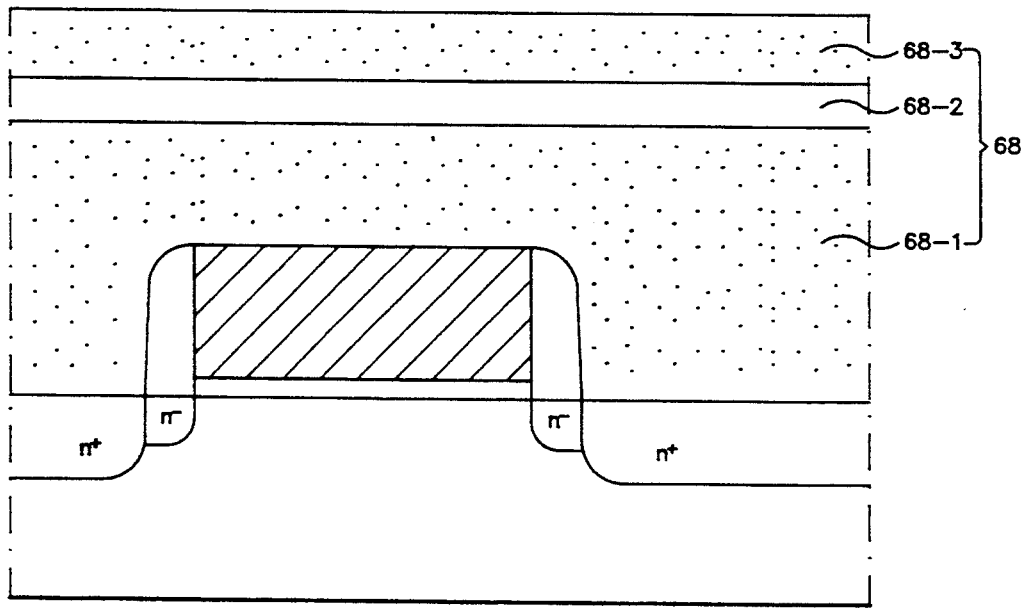

F I G.6f
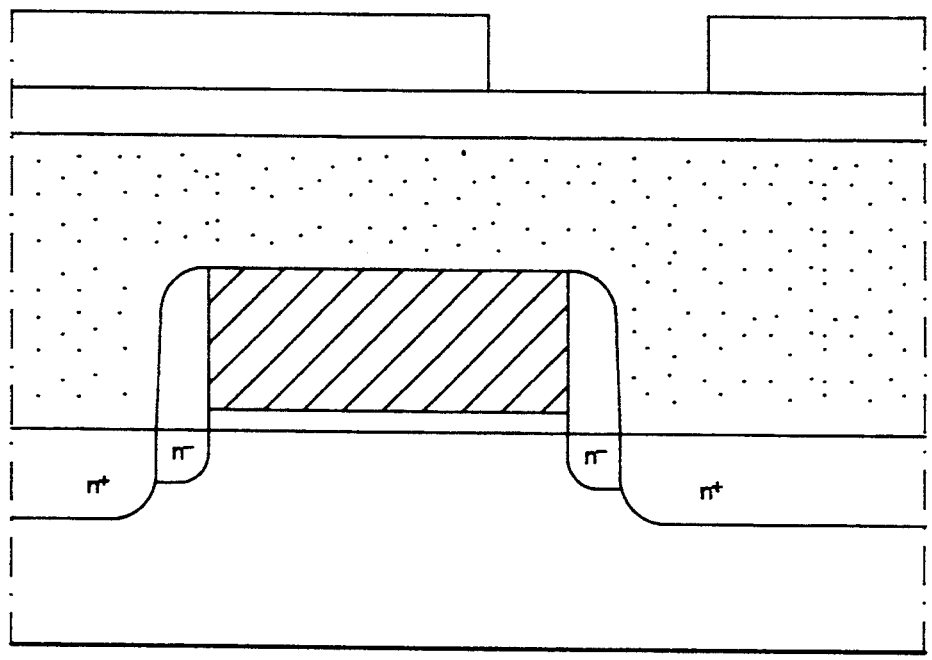
F I G.6g
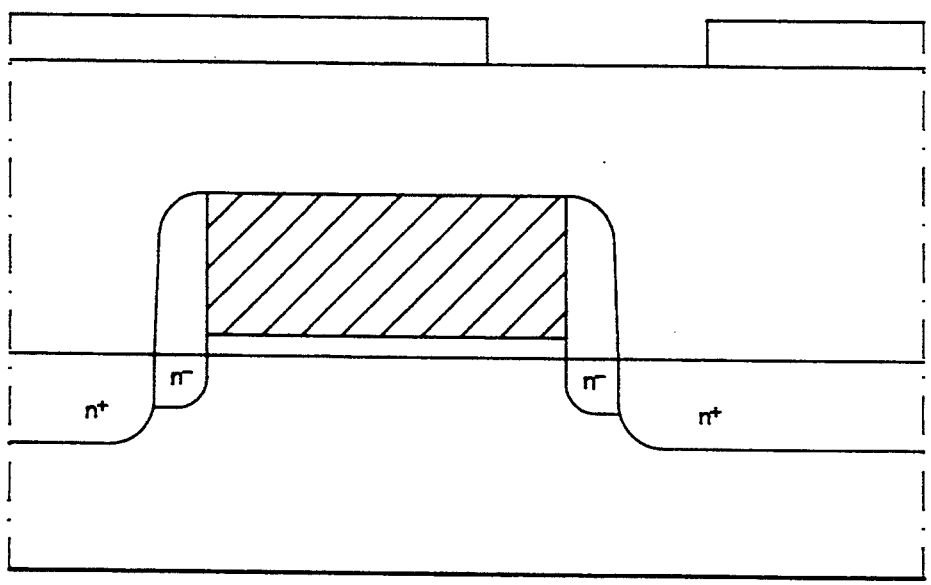

METHOD FOR FABRICATING LDD TRANSITOR UTILIZING HALO IMPLANT

BACKGROUND OF THE INVENTION

1. Field of the Invention

The present invention relates to a method for fabricating a transistor, and more particularly to a method for fabricating an asymmetrical lightly doped drain transistor.

2. Description of the Prior art

In scaling a MOSFET down to deep submicron, a short channel effect may occur. For eliminating such short channel effect, there have been conventionally proposed various methods such as a method of forming source/drain regions with a shallow junction, a method of forming a gate electrode with a small thickness, and a deep channel implantation method of deeply implanting channel ions in a substrate.

These methods can solve the short channel effect occurring in deep submicron MOSFETs. However, they involve a problem that a hot carrier effect occurs.

In other words, where the above-mentioned conventional methods are used for solving the short channel effect, a high electric field occurs at edge portions of a gate electrode formed, thereby causing a generation of hot carriers. These hot carriers serve to degrade an operation characteristic of a MOSFET fabricated and reduce the use life of the MOSFET.

As another method for reducing the short channel effect, there have been also proposed a method of doping a bulk, namely, a substrate in a high concentration. However, this method involves a problem that a junction capacitance in source/drain regions increases due to the high impurity concentration. This is because the junction capacitance in the source/drain region of MOSFET is proportional to the impurity concentration.

In designing submicron MOSFETs, therefore, it is important to basically solve both the short channel effect and the hot carrier effect.

For solving both the short channel effect and the hot carrier effect, MOSFETs having various structures have been proposed.

For example, a lightly doped drain (LDD) MOSFET has been proposed in which a drain region has a double structure including a highly doped impurity region and a lightly doped impurity region disposed adjacent to the highly doped impurity region so as to reduce a hot carrier effect occurring in a MOSFET having a channel length of 1 $\mu$m.

For improving such a LDD MOSFET, there have been also proposed a double implanted-LDD (DI-LDD) which is adapted to maintain a punch-through and improve a threshold in a MOSFET having a channel length of about 0.6 $\mu$m.

FIG. 1 illustrates a sectional structure of a conventional DI-LDD MOSFET.

As shown in FIG. 1, the DI-LDD MOSFET includes source/drain regions constituted by n+ type regions 14 and 15 and n type regions 16 and 17 formed in a substrate 11, and a gate insulating film 12 and a gate film 13 formed over a channel region, as in a well-known LDD MOSFET structure. The DI-LDD MOSFET further includes p type regions 18 and 19 surrounding the source/drain regions.

In the DI-LDD MOSFET, the p type halo region 18 surrounds the n+ type region 14 and the n type region 16 constituting the source region, whereas the p type halo region 19 surrounds the n+ type region 15 and the n type region 17 constituting the drain region. Accordingly, the DI-LDD MOSFET has a symmetry in structure. Furthermore, the DI-LDD MOSFET has an electrically symmetric operation characteristic.

In this DI-LDD MOSFET, however, the p type halo regions 18 and 19 serving as punch-through stoppers should have a higher impurity concentration at a smaller channel length so as to maintain a punch-through.

This results in an increase in electric field occurring in the drain region and thereby degradations in breakdown characteristic and hot carrier reliability. As a result, there is a problem that the DI-LDD structure can not be employed in a MOSFET having a channel length of no more than 0.25 $\mu$m (namely, sub-quarter micron).

Moreover, the increased impurity concentration in the p type halo regions 18 and 19 respectively surrounding the source and drain regions results in an increase in junction capacitance of the source/drain regions and thereby a degradation in operation characteristic of the device.

Recently, there have been proposed an asymmetry halo source gate-overlapped LDD (HS-GOLD) MOSFET which includes a gate-overlapped LDD formed at a drain region, and a halo region formed at a source region and having an opposite conductivity to the source region. Such an asymmetry HS-GOLD MOSFET is disclosed by Buti et al., IEEE Trans. on Electron Device, Vol. 38, No. 8, pp 1757~1764, 1991.

FIGS. 2A and 2B are sectional views illustrating a method for manufacturing a conventional asymmetry HS-GOLD MOSFET. In accordance with the illustrated method, ions are implanted in a p type substrate 21 so as to adjust a threshold voltage $V_T$. Thereafter, a gate oxide film 22 is formed over the substrate 21. Over the gate oxide film 22, a polysilicon film is deposited which is, in turn, subjected to a patterning to form a gate 23. A CVD oxide film 24 is deposited to a small thickness over the entire exposed surface of the resulting structure.

Subsequently, n type impurity ions are implanted at a large tilt angle $\phi$ in the substrate 21 by use of a large tilt implantation process so as to a n type large-tilt implanted drain region 25. In similar, p type impurity ions are implanted in the substrate 21 at a large tilt angle $\alpha$ by use of the large tilt implantation process so as to a p type halo region 26 (FIG. 2A).

Over the entire exposed surface of the resulting structure, an oxide film is then formed. The oxide film is subjected to an anisotropic etch process so as to form spacers 27 at respective side walls of the gate 23.

Thereafter, n type impurity ions are implanted in the substrate 21 in a high concentration by use of a well-known ion implantation process, thereby forming an n+ region 28 as a drain region and a n+ region 29 as a source region. A formation of a tungsten silicide ($TiSi_2$) 30 is achieved (FIG. 2B).

In this asymmetry HS-GOLD MOSFET in which its source region has the p type halo region 26 as a punch-through stopper whereas its drain region has a well-known LDD structure, an electrical asymmetry structure doping profile of the source/drain regions can be optimized so that both the punch-through resistance and the hot carrier reliability can be satisfied.

Since unnecessary LDD structures are omitted from the source region, it is possible to reduce the series resistance and the overlap capacitance of the source region. In addition, no provision of any p type halo region in the drain region makes it possible to reduce the junction capacitance of the drain region and thus improve a circuit operation capacity.

FIGS. 3 to 5 illustrate various characteristics of the conventional asymmetry HS-GOLD MOSFET, respectively.

FIG. 3 shows a superior saturation threshold ($V_{Tsat}$) characteristic. Referring to FIGS. 4 and 5, it can be found that $V_{DSmax}$ ($I_{sub}=1$ V/μm) is higher than those of other conventional structures by about 0.7 V.

However, the large tilt implantation process used for fabricating the conventional asymmetry HS-GOLD MOSFET can be only employed in fabrication of transistors which are arranged in one direction on a wafer. This process can not be employed in fabrication of transistors optionally arranged.

Where the large tilt implantation process is employed, there is a limitation on the number of transistors packed because the transistors are arranged in one direction on a wafer. As a result, a considerable decrease in packing density is encountered in practical fabrication of VLSI.

SUMMARY OF THE INVENTION

Therefore, an object of the invention is to provide a method for fabricating an asymmetry HS-GOLD MOSFET by use of a photo etch process in place of a large tilt implantation process, capable of improving a packing density and reducing a junction capacitance of a source region, thereby improving a characteristic of a device to be finally produced.

In accordance with the present invention, this object can be accomplished by providing a method for fabricating a transistor comprising the steps of: forming a gate insulating film and a gate on a low concentration semiconductor substrate of a first conductivity type; implanting impurity ions of a second conductivity type in said semiconductor substrate under a condition that said gate is used as a mask so as to symmetrically form low concentration source and drain regions of said second conductivity type in the semiconductor substrate; forming an insulating film over the entire exposed surface of the resulting structure, and subjecting said insulating to an anisotropic etching to form spacers at respective side walls of the gate; implanting impurity ions of said second conductivity type in the semiconductor substrate under a condition that said spacers and gate are used as a mask so as to form high concentration source and drain regions of the second conductivity type respectively adjacent to said low concentration source and drain regions; coating over a photoresist film over the entire exposed surface of the resulting structure, and subjecting said photoresist film to a patterning to expose one of the spacers disposed toward the low concentration source region; removing said exposed spacer; and implanting impurity ions of said first conductivity type in the semiconductor substrate through an area defined by removal of the spacer so as to form a p type halo region in a region occupied by the low concentration source region.

BRIEF DESCRIPTION OF THE DRAWINGS

Other objects and aspects of the invention will become apparent from the following description of embodiments with reference to the accompanying drawings in which:

FIGS. 6A to 6J are sectional views illustrating a method for fabricating a MOSFET having an asymmetry HS-GOLD structure in accordance with the present invention, respectively.

DETAILED DESCRIPTION OF THE PREFERRED EMBODIMENTS

FIGS. 6A to 6J are sectional views illustrating a method for fabricating a MOSFET having an asymmetry HS-GOLD structure in accordance with the present invention, respectively.

The method of the present invention comprises main steps of forming source and drain regions each having a low concentration impurity region and a high concentration impurity region by use of a well-known LDD formation process, and forming a p type halo region in the source region adjacent to the high concentration impurity region of the source region.

FIGS. 6A to 6D illustrate the step of forming source and drain regions by use of the well-known LDD formation process.

Figure 6A:
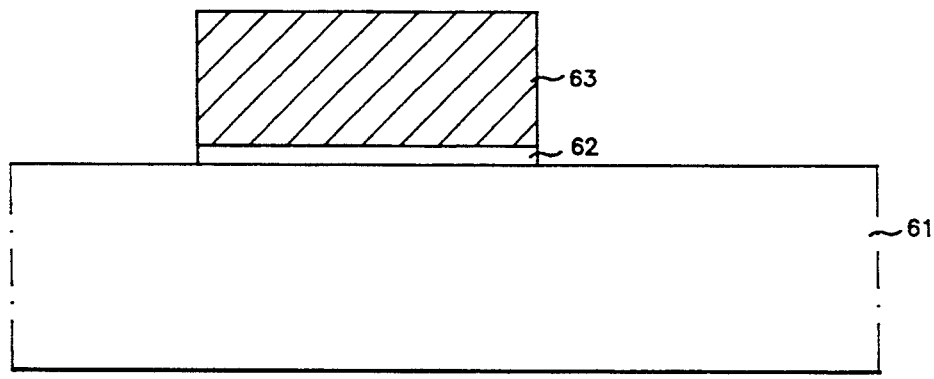

At this step, on a p type semiconductor substrate 61, a gate insulating film 62 is formed, as shown in FIG. 6A. Thereafter, a polysilicon layer is deposited over the gate insulating film 62 and then subjected to a patterning so as to form a gate 63.

Figure 6B:
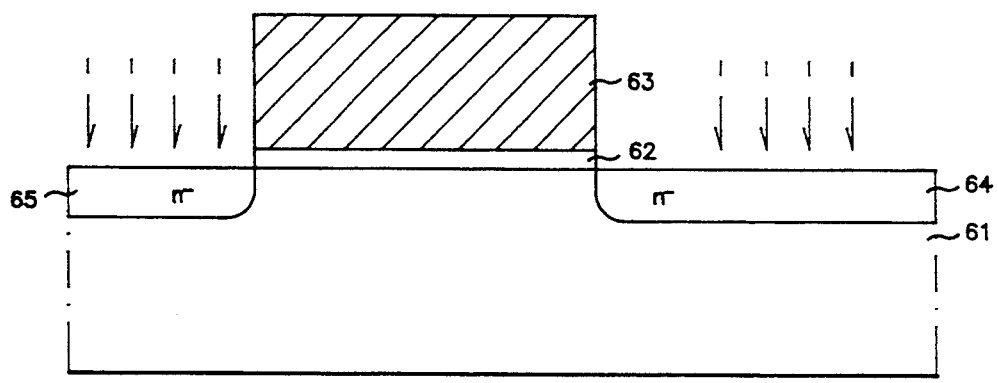

Using the gate 63 as a mask, n type impurity ions are then implanted in the substrate 61 in a low concentration, thereby forming n− regions 64 and 65 for respective source drain regions, as shown in FIG. 6B.

As shown in FIG. 6C, an insulating film is then formed over the entire exposed surface of the resulting structure. The insulating film is subjected to an anisotropic etch process so that spacers 66-1 and 66-2 are formed at side walls of the gate 63, respectively.

Using the gate 63 and the spacers 66-1 and 66-2 as a mask, n type impurity ions are then implanted in the substrate 61 in a high concentration to form n+ regions 67 and 68. Thus an LDD structure is obtained, as shown in FIG. 6D.

FIGS. 6E to 6J illustrate the step of forming the p type halo region in the source region by use of a well-known photo etch process, namely, a tri-level resist (TLR) process.

At this step, a tri-level photoresist film 68 is coated over the entire exposed surface of the resulting structure by use of the TLR process, as shown in FIG. 6E.

The tri-level photoresist film 68 has a tri-level structure including a lower photoresist film 68-1, an intermediate SOG film 68-2, and an upper photoresist film 68-3.

As shown in FIG. 6F, the upper photoresist film 68-3 of the tri-level photoresist film 68 is then subjected to a patterning using a photolithography process. By this patterning, a pattern is formed which is adapted to expose the side wall spacers 66-1 disposed toward the source region.

using the upper photoresist film 68-3 as a mask, the SOG film 68-2 is then etched, as shown in FIG. 6G. Thereafter, the remaining upper photoresist film 68-3 is removed.

Figure 6H:
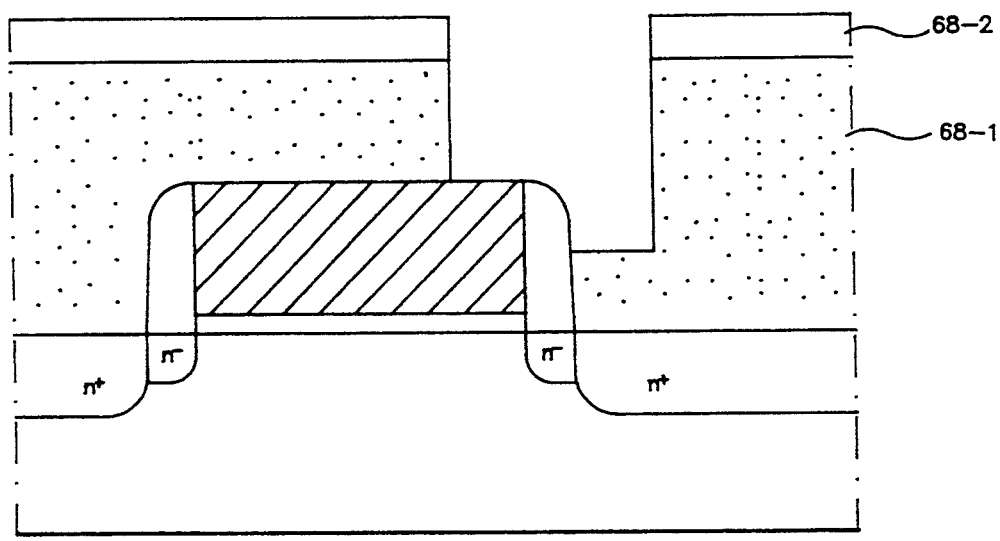

A lower photoresist film 68-1 is then subjected to a dry etching using the SOG film 68-2 as a mask, as shown in FIG. 6H. In the dry etching, an etch end point is predetermined so that the etching is completed at the etch end point after a predetermined period elapses. After completion of the etching, the spacer 66-1 disposed toward the source region is exposed.

Figure 6I:
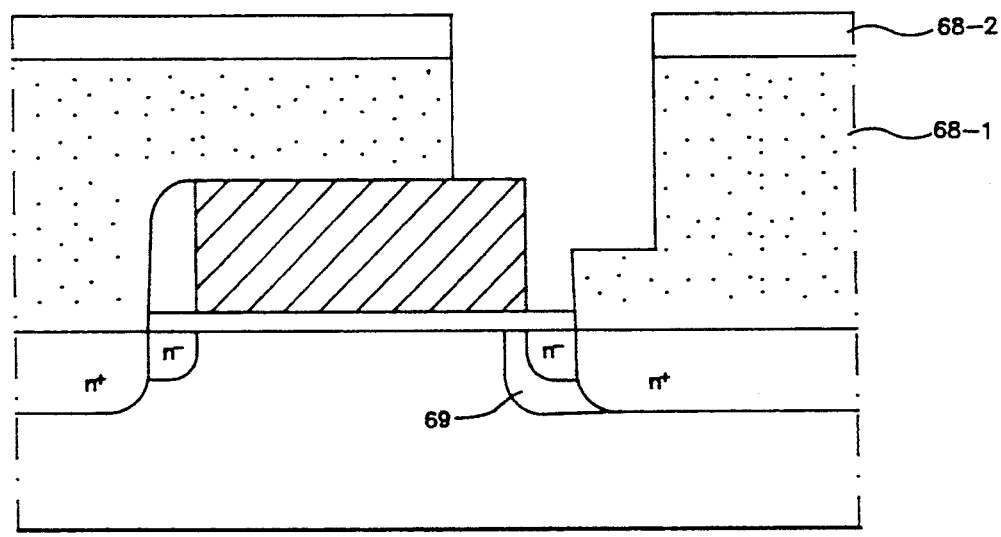

As shown in FIG. 6I, the exposed spacer 66-1 is then removed so that p type impurity ions are implanted in a portion of the substrate 61 exposed by virtue of removal of the exposed spacer 66-1. By this ion implantation, a p$^-$ type halo region 69 is formed.

The p type impurity ion implantation for forming the p$^-$ type halo region 69 is carried out under a condition that dose amount and injection energy of impurity ions implanted are optimized depending on structure of a device to be produced.

In a p type MOSFET, a n$^-$ type halo region is formed.

Figure 6J:
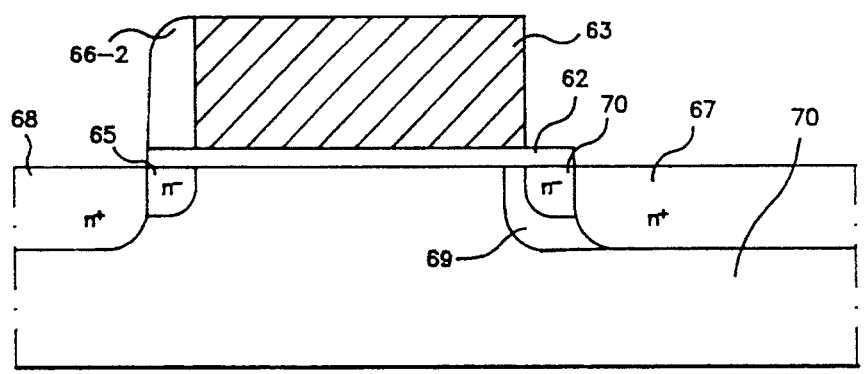

Finally, the remaining lower photoresist film 68-1 and SOG film 68-2 are removed, shown in FIG. 6J. Thus an asymmetry HS-GOLD MOSFET is obtained which has a drain region including a LDD structure having the low concentration n$^-$ region 65 and the high concentration n$^+$ region 70, and a source region including a single n$^+$ region 67 and a p$^-$ halo region 69 disposed adjacent to the high concentration n$^+$ region 67 and adapted to serve as a punch-through stopper.

Figure 1:
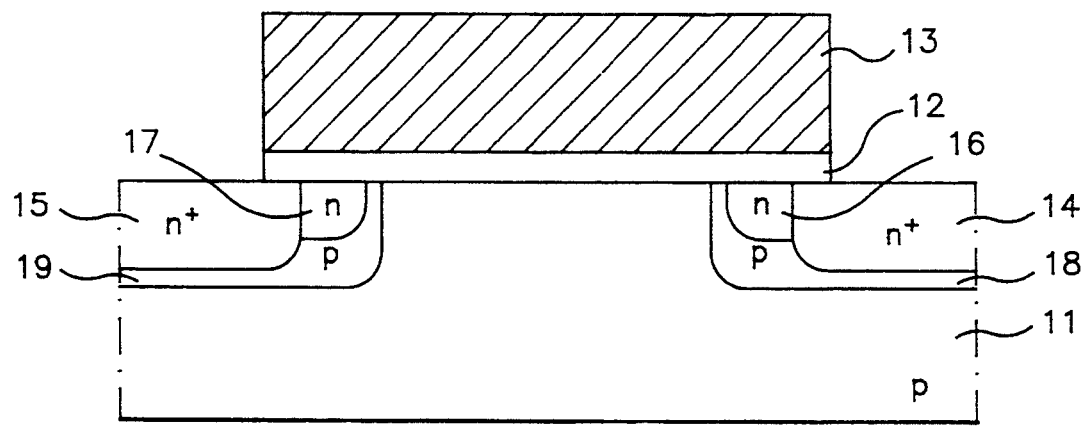
FIG. 1 is a sectional view illustrating a sectional structure of a conventional DI-LDD MOSFET.
Figure 2A:
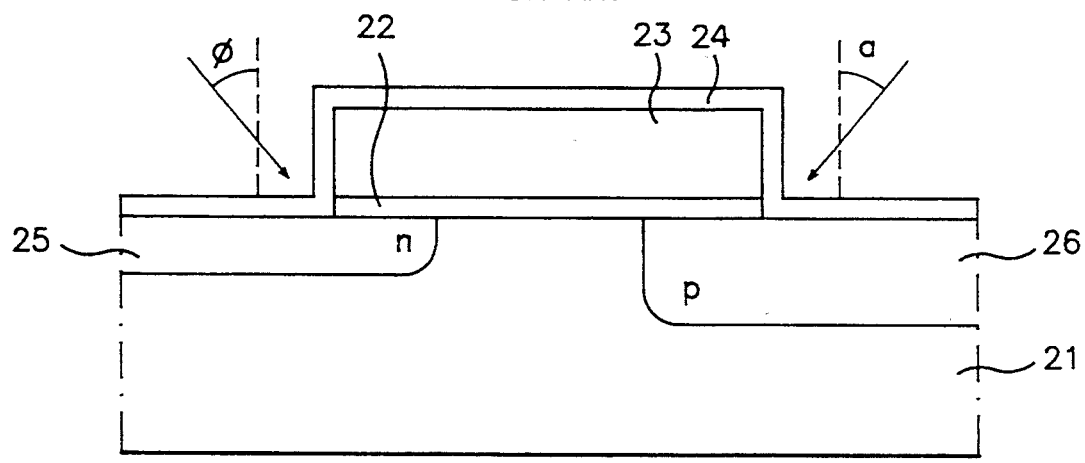
FIG. 2A and 2B are sectional views illustrating a method for manufacturing a conventional asymmetry HS-GOLD MOSFET, respectively.
Figure 2B:
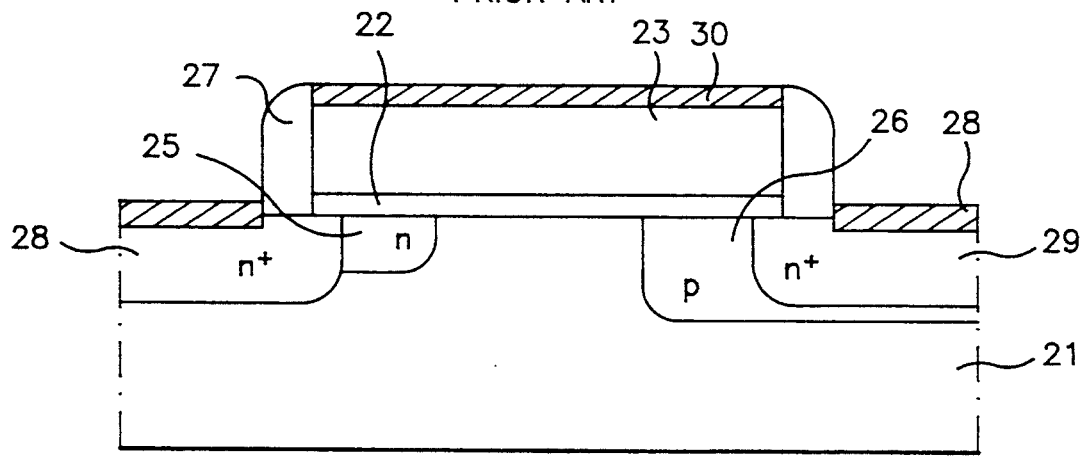
Figure 3:
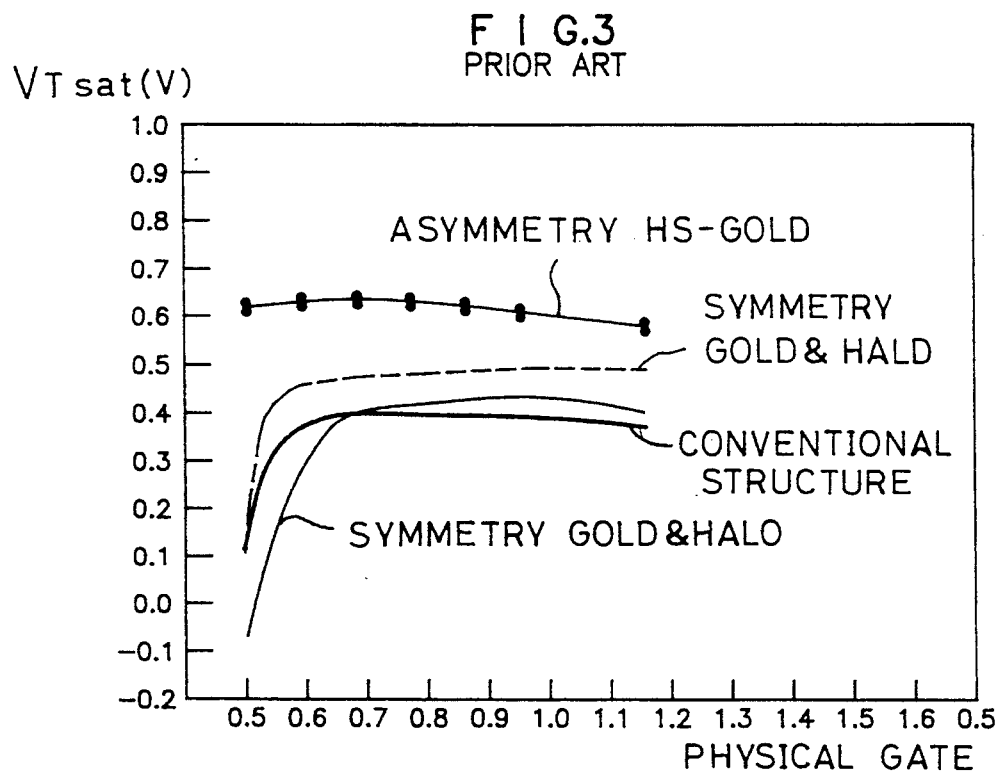
FIG. 3 is a graph illustrating a function of $V_T$ to physical gate length in the asymmetry HS-GOLD MOSFET of FIGS. 2A and 2B.
Figure 4:
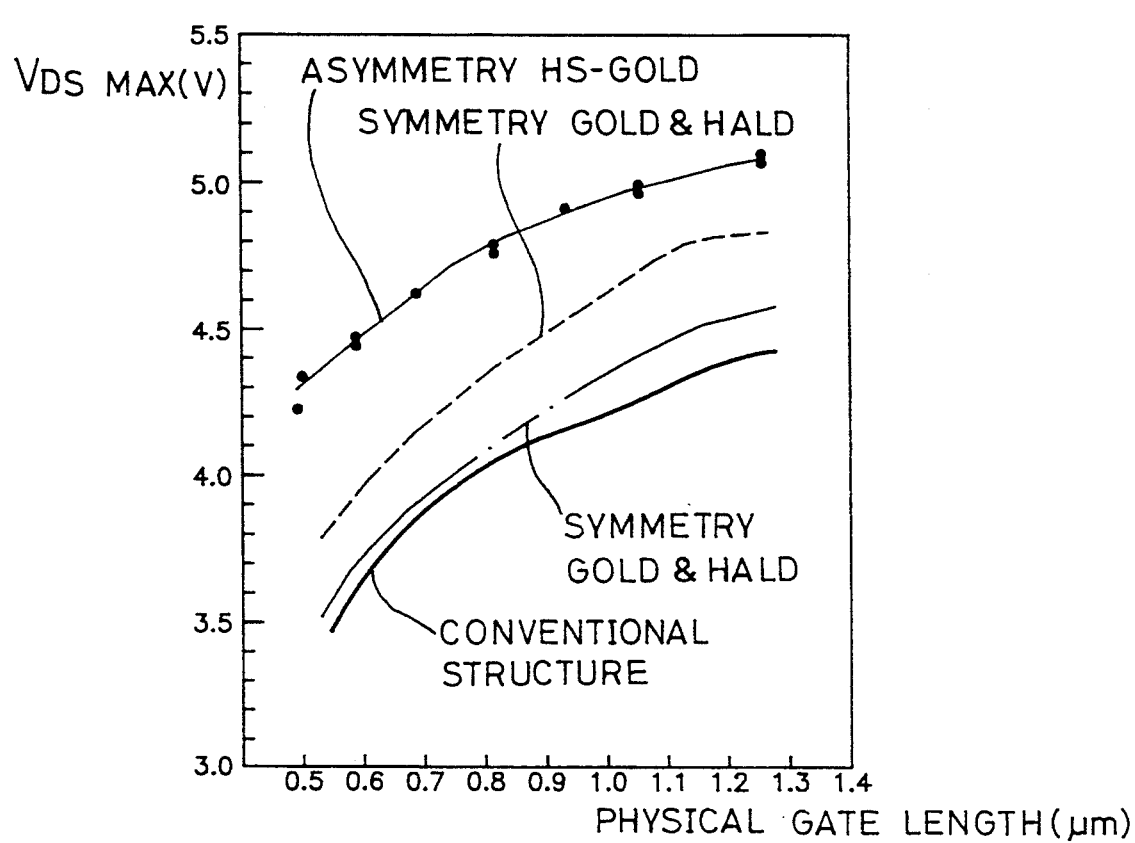
FIG. 4 is a graph illustrating a function of $V_{DSmax}$ to physical gate length in the asymmetry HS-GOLD MOSFET of FIGS. 2A and 2B.
Figure 5:
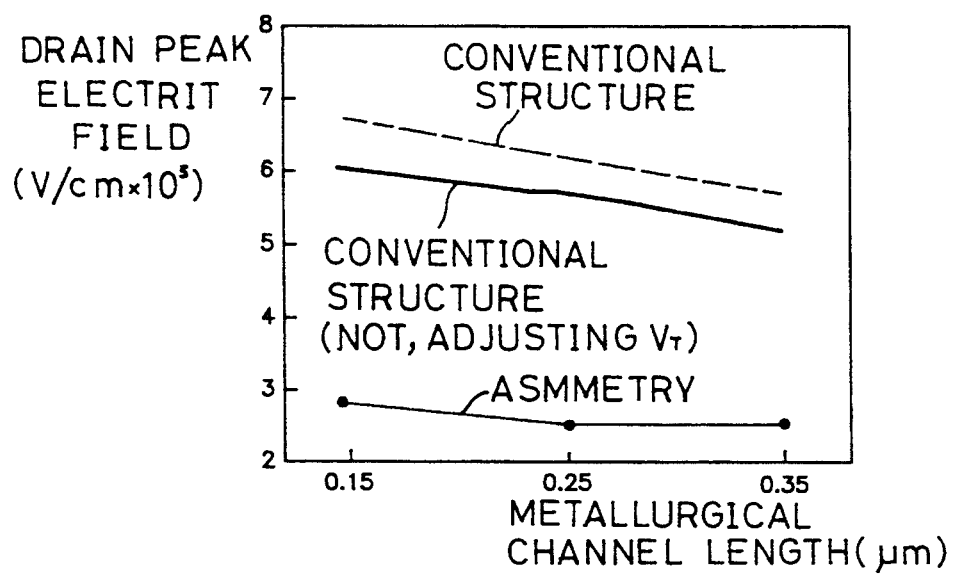
FIG. 5 is a graph illustrating a function of drain peak electric field to metallurgical gate length in the asymmetry HS-GOLD MOSFET of FIGS. 2A and 2B.

The conventional asymmetry HS-GOLD MOSFET has a structure in which the p type halo region 26 surrounds the source region, as shown in FIG. 2B. On the other hand, the asymmetry HS-GOLD MOSFET of the present invention has a structure in which the p$^-$ halo region 69 is disposed adjacent to the n$^+$ region 67 as the source region, as shown in FIG. 6J.

As apparent from the above description, the present invention provides an asymmetry HS-GOLD MOSFET in which a p$^+$ halo region as a punch-through stopper is formed by use of a photo etch process and an ion implantation process utilizing a tri-level photoresist film. Accordingly, it is possible to easily and simply fabricate an asymmetry HS-GOLD MOSFET without using additional process steps which are required in the prior art.

In accordance with the present invention, advantages of the asymmetry HS-GOLD MOSFET such as a superior short channel effect, a hot carrier reliability and a superior electrical operation characteristic are still obtained, as in the prior art. In forming the halo region, the present invention does not use a large tilt implantation process which is used in the prior art. As a result, the method of the present invention can be usefully applied to packing of transistors optionally arranged on a wafer. This makes it possible to increase a packing density where the present invention is applied to fabrication of VLSI.

In accordance with the present invention, the halo region is formed such that it is disposed adjacent to the high concentration source region, without surrounding it. This provides a decreased junction capacitance of the source region, over the prior art. Consequently, it is possible to obtain MOSFETS having a channel length of sub-quarter micron (0.25 μm) which is operable at a source voltage of 3.5 V.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a transistor comprising the steps of:

forming a gate insulating film and a gate on a low concentration semiconductor substrate of a first conductivity type;

implanting impurity ions of a second conductivity type in said semiconductor substrate under a condition that said gate is used as a mask so as to symmetrically form low concentration source and drain regions of said second conductivity type in the semiconductor substrate;

forming an insulating film over the entire exposed surface of the resulting structure, and subjecting said insulating to an anisotropic etching to form spacers at respective side walls of the gate;

implanting impurity ions of said second conductivity type in the semiconductor substrate under a condition that said spacers and gate are used as a mask so as to form high concentration source and drain regions of the second conductivity type respectively adjacent to said low concentration source and drain regions;

coating a photoresist film over the entire exposed surface of the resulting structure, and subjecting said photoresist film to a patterning to expose one of the spacers disposed toward the low concentration source region;

removing said exposed spacer; and implanting impurity ions of said first conductivity type in the semiconductor substrate through an area defined by removal of the spacer so as to form a p type halo region in a region occupied by the low concentration source region.

2. A method in accordance with claim 1, wherein said exposure of one of the spacers disposed toward the low concentration source region is achieved by use of a tri-level resist process.

3. A method in accordance with claim 2, wherein said exposure is achieved by the steps of:

coating a tri-level photoresist film including a lower photoresist film, an SOG film and an upper photoresist film over the entire exposed surface of the resulting structure after the formation of said high concentration source and drain regions;

subjecting said upper photoresist film to a patterning using a photolithography process;

subjecting said SOG film to a patterning under a condition that said patterned upper photoresist film is used as a mask;

removing the remaining upper photoresist film;

etching said lower photoresist film under a condition that said patterned SOG film is used as a mask so as to expose said spacer disposed toward the low concentration source region; and sequentially removing the remaining SOG film and lower photoresist film.

* * * * *